(12) United States Patent
Lin et al.

(10) Patent No.: US 12,349,309 B2
(45) Date of Patent: Jul. 1, 2025

(54) CENTRIFUGAL HEAT DISSIPATION FAN

(71) Applicant: Acer Incorporated, New Taipei (TW)

(72) Inventors: Yu-Ming Lin, New Taipei (TW);
Wen-Neng Liao, New Taipei (TW);
Cheng-Wen Hsieh, New Taipei (TW);
Tsung-Ting Chen, New Taipei (TW);
Sheng-Yan Chen, New Taipei (TW);
Chun-Chieh Wang, New Taipei (TW)

(73) Assignee: Acer Incorporated, New Taipei (TW)

( * ) Notice: Subject to any disclaimer, the term of this patent is extended or adjusted under 35 U.S.C. 154(b) by 169 days.

(21) Appl. No.: 18/302,783

(22) Filed: Apr. 18, 2023

(65) Prior Publication Data
US 2023/0337391 A1 Oct. 19, 2023

(30) Foreign Application Priority Data

Apr. 19, 2022 (TW) .................................. 111114837

(51) Int. Cl.
| | | |
|---|---|---|
| *H05K 7/20* | (2006.01) | |
| *F04D 17/16* | (2006.01) | |
| *F04D 29/28* | (2006.01) | |

(52) U.S. Cl.
CPC ......... *H05K 7/20172* (2013.01); *F04D 17/16* (2013.01); *F04D 29/282* (2013.01); *F05D 2250/184* (2013.01)

(58) Field of Classification Search
CPC ...... F04D 29/281; F04D 29/30; F04D 29/666; F04D 17/16; F04D 29/282; F04D 29/4226; F04D 29/544; F04D 29/663; F04D 29/384; F04D 29/388; F05D 2250/184; F05D 2240/303; G06F 1/20; G06F 2200/201; H05K 7/20172; H05K 7/20136; H05K 7/20145; H05K 7/20154
See application file for complete search history.

(56) References Cited

U.S. PATENT DOCUMENTS

| | | | | |
|---|---|---|---|---|
| 6,348,086 | B1 * | 2/2002 | Harms | B01D 46/0056 55/438 |
| 7,455,504 | B2 * | 11/2008 | Hill | F04D 17/167 416/179 |
| 10,247,196 | B2 * | 4/2019 | Lin | F04D 17/16 |
| 11,118,598 | B2 * | 9/2021 | Kennedy | G06F 1/20 |
| 2006/0204363 | A1 * | 9/2006 | Yen | F04D 29/281 416/228 |
| 2009/0135560 | A1 | 5/2009 | Hill et al. | |
| 2012/0251323 | A1 * | 10/2012 | Chiu | F04D 29/188 416/198 R |

(Continued)

FOREIGN PATENT DOCUMENTS

| | | |
|---|---|---|
| CN | 103438024 | 12/2013 |
| CN | 111980966 | 11/2020 |
| TW | M545842 | 7/2017 |

*Primary Examiner* — Michael A Matey
(74) *Attorney, Agent, or Firm* — JCIPRNET

(57) ABSTRACT

Provided is a centrifugal heat dissipation fan including a housing and an impeller. The impeller is disposed in the housing. The impeller has a hub and multiple blades disposed surrounding the hub. Every two adjacent blades have different blade structures relative to the housing such that the blade structures pass by a fixed position of the housing and generate blade tones of varying frequencies when the impeller rotates.

14 Claims, 6 Drawing Sheets

(56) References Cited

U.S. PATENT DOCUMENTS

| | | | |
|---|---|---|---|
| 2013/0309077 A1* | 11/2013 | Su | F04D 29/30 |
| | | | 415/203 |
| 2014/0290918 A1* | 10/2014 | Chen | F28D 15/0275 |
| | | | 165/104.26 |
| 2014/0308118 A1* | 10/2014 | Lin | F04D 17/16 |
| | | | 415/203 |
| 2015/0030441 A1* | 1/2015 | Wu | F04D 29/666 |
| | | | 415/203 |
| 2017/0002836 A1* | 1/2017 | Herrou | F04D 29/281 |
| 2017/0260994 A1* | 9/2017 | Xu | F04D 29/626 |
| 2019/0128279 A1* | 5/2019 | Yu | G06F 1/203 |
| 2020/0191157 A1* | 6/2020 | Lin | F04D 29/282 |
| 2020/0370563 A1* | 11/2020 | Chen | F04D 29/181 |
| 2021/0317839 A1* | 10/2021 | Chen | F04D 17/08 |
| 2021/0321533 A1* | 10/2021 | Chen | H05K 7/20145 |
| 2021/0324873 A1* | 10/2021 | Lin | F04D 29/325 |
| 2022/0290684 A1* | 9/2022 | Lin | F04D 29/281 |
| 2023/0100668 A1* | 3/2023 | Li | G06F 1/203 |
| | | | 361/679.48 |

\* cited by examiner

CENTRIFUGAL HEAT DISSIPATION FAN

CROSS-REFERENCE TO RELATED APPLICATION

This application claims the priority benefit of Taiwan application serial no. 111114837, filed on Apr. 19, 2022. The entirety of the above-mentioned patent application is hereby incorporated by reference herein and made a part of this specification.

BACKGROUND

Technical Field

The disclosure relates to a heat dissipation fan, and more particularly to a centrifugal heat dissipation fan.

Description of Related Art

With the development of technology, portable electronic devices such as notebook computers and smart phones have been widely used in daily life. While electronic devices are improved to meet people's requirements for small size and high performance, how to deal with the thermal energy generated during operation is a major issue for improving the operational performance of electronic devices. Therefore, a heat dissipation module or a heat dissipation element such as a heat dissipation fan is usually disposed in an electronic device to help dissipate the thermal energy generated during operation out of the electronic device.

With a centrifugal impeller as an example, in the method of manufacturing a centrifugal impeller, a hub and fan blades are usually integrally formed through plastic injection, metal die casting, or sheet metal stamping. If the fan blades are plastic, it is difficult to reduce the thickness of the fan blades due to the material properties, which leads to a smaller spacing between two fan blades and thus reduces the heat dissipation performance of the impeller. As a result, the only way to enhance the air pressure and air volume of the centrifugal impeller is to increase the rotational speed. However, the increased rotational speed of the impeller in turn generates more noise.

Therefore, how to improve the impeller's related structure to improve its heat dissipation performance and reduce the noise it generates is actually an issue that people skilled in the art have to consider and solve.

SUMMARY

The disclosure provides a centrifugal heat dissipation fan, with blades thereof having different blade structures and thus generating blade tones of varying frequencies during rotation to reduce noise.

The centrifugal heat dissipation fan of the disclosure includes a housing and an impeller. The impeller is disposed in the housing. The impeller has a hub and multiple blades disposed surrounding the hub. Every two adjacent blades have different blade structures relative to the housing such that the blade structures pass by a fixed position of the housing and generate blade tones of varying frequencies when the impeller rotates.

Based on the above, with the blades of the centrifugal heat dissipation fan having different blade structures, which pass by the fixed position of the housing and generate the blade tones of varying frequencies when the impeller rotates at a fixed speed, noise energy at fixed frequencies or multiples thereof can be avoided to be accumulated such that the desired effect of fan blade noise reduction can be achieved.

DESCRIPTION OF THE EMBODIMENTS

Figure 1:
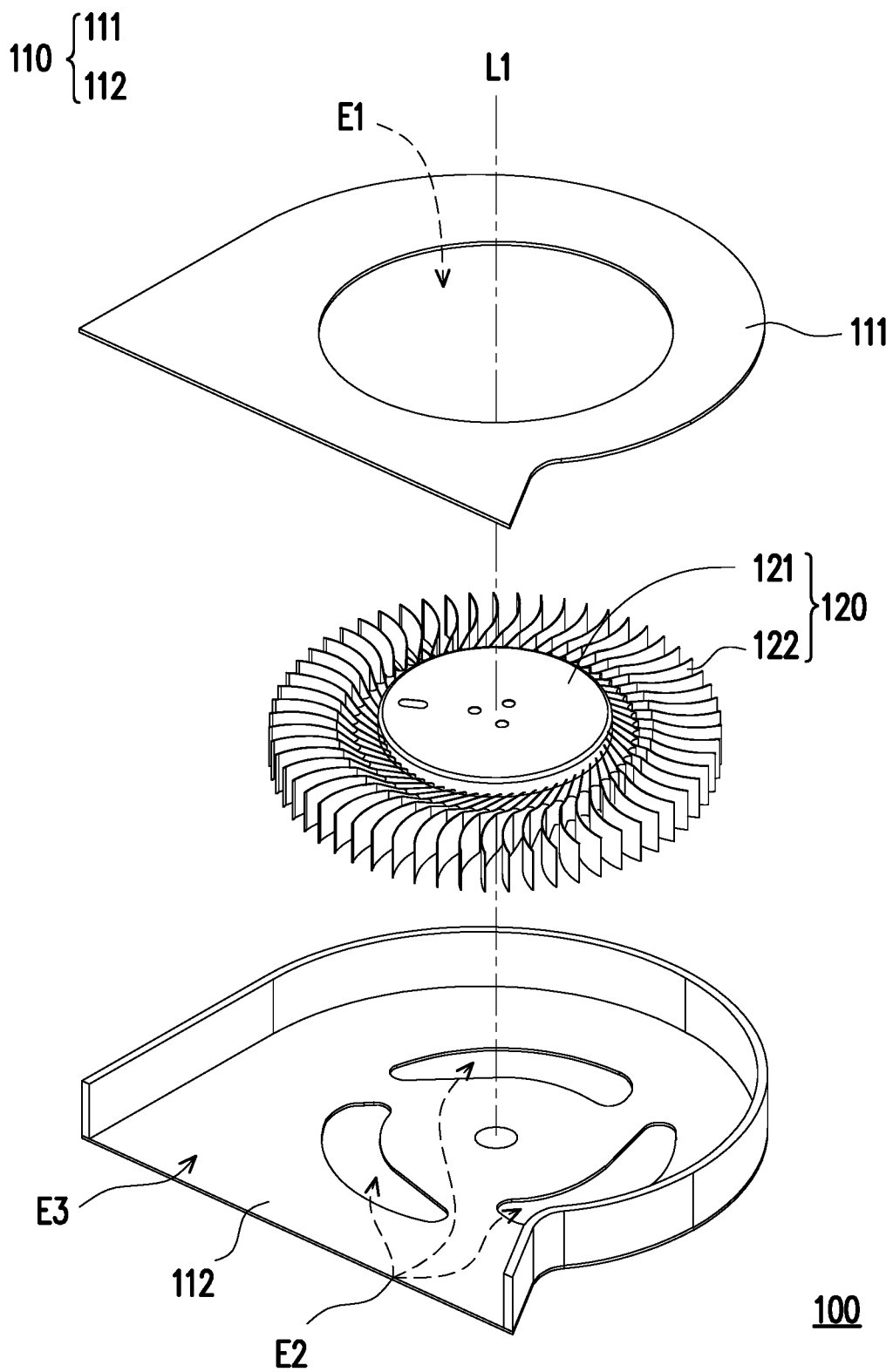
FIG. 1 is an exploded view of a centrifugal heat dissipation fan according to an embodiment of the disclosure.
Figure 2:
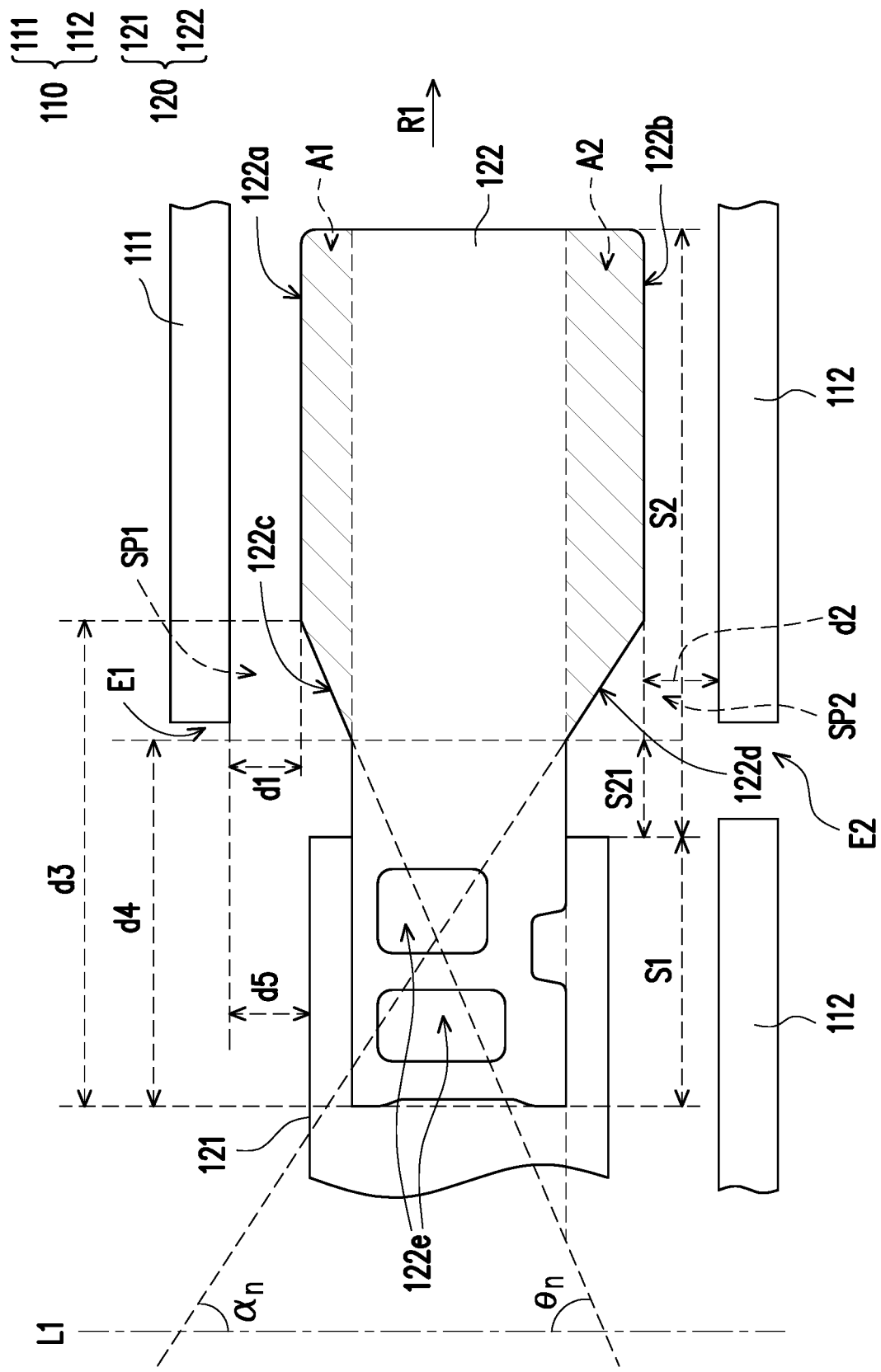
FIG. 2 is a partial front view of an impeller in FIG. 1.

FIG. 1 is an exploded view of a centrifugal heat dissipation fan according to an embodiment of the disclosure. FIG. 2 is a partial front view of an impeller in FIG. 1. With reference to FIG. 1 and FIG. 2 together, in this embodiment, a centrifugal heat dissipation fan 100 includes a housing 110 and an impeller 120. The housing 110 includes a top plate 111 and a base plate 112. The top plate 111 is disposed with an air inlet E1, and the base plate 112 is disposed with an air inlet E2. After the top plate 111 and the base plate 112 are combined, an air outlet E3 is formed. The impeller 120 is disposed in the housing 110 and located between the top plate 111 and the base plate 112. The impeller 120 has a hub 121 and multiple blades 122 disposed surrounding the hub 121. The impeller 120 has a rotation axis L1 in the housing 110, so that when the impeller 120 rotates, the air in the external environment is sucked into the housing 110 through the air inlets E1 and E2, and is exhausted from the housing 110 through the air outlet E3 to perform heat dissipation on a target object, such as a processor, a display chip, or a heat dissipation fin disposed in an electronic device.

As mentioned above, when an impeller in the prior art rotates at a fixed rotational speed, blades sweep through the housing space and generate blade tones of a fixed frequency, causing energy accumulation and generating noise. Therefore, in order to effectively reduce the blade noise, in the impeller 120 of this embodiment, every two adjacent blades 122 have different blade structures relative to the housing 110. In this way, when the impeller 120 rotates, these blade structures pass through a fixed position of the housing 110 and generate blade tones of varying frequencies to avoid tone energy accumulation at the same frequency.

With reference to FIG. 2 again, only one single blade 122 is shown for illustration. In this embodiment, the aforementioned blade structure is the blade edge of the blade 122, which includes an upper blade edge 122a and a lower blade edge 122b of the blade 122 as shown in the figure. Furthermore, each blade 122 has a combining section S1 and an air suction section S2. The combining section S1 is combined with the hub 121. For example, by in-mold injection combining the hub 121 with the combining section S1 when the hub 121 is formed, the combining section S1 is embedded in the hub 121, and the structure of the hub 121 can pass through an opening 122e of the blade 122 to enhance the combining strength of the two. Moreover, the air suction section S2 extends from the combining section S1 in a direction along a radial direction R1 relative to the rotation axis L1. During extension, the size of the air suction section S2 gradually increases along the rotation axis L1. In other words, the size of the combining section S1 along the rotation axis L1 is smaller than the size of the air suction section S2 along the rotation axis L1, so that the air suction section S2 has air guiding inclined edges 122c and 122d near the combining section S1. Herein, the air guiding inclined edge 122c is located on the upper blade edge 122a of the blade 122, and the air guiding inclined edge 122d is located on the lower blade edge 122b of the blade 122.

Accordingly, the purpose of making every two adjacent blades 122 have different blade structures mentioned above is to allow a designer to provide the air guiding inclined edges 122c and 122d in different sizes for different blades 122. As shown in FIG. 2, the blades 122 are provided with the air guiding inclined edges 122c and 122d in different sizes, which means the blade edges of the blades 122 keep different spacings from the housing 110. With FIG. 2 as an example, for the upper blade edge 122a, changing the size of the air guiding inclined edge 122c is to change a spacing d1 between the upper blade edge 122a and the top plate 111, while changing the air guiding inclined edge 122d is to change a spacing d2 between the lower blade edge 122b and the base plate 112.

In detail, since the air guiding inclined edges 122c and 122d respectively correspond to the air inlets E1 and E2, tapered spaces SP1 and SP2 are formed by the blade structures (the air guiding inclined edges 122c and 122d), the top plate 111, and the base plate 112 of the housing 110. The tapered spaces SP1 and SP2 taper from the air inlets E1 and E2 of the centrifugal heat dissipation fan 100 relative to the rotation axis L1 of the impeller 120 in the radial direction R1. In this way, when the impeller 120 rotates about the rotation axis L1, the blades 122 sweep through the space in the housing 110 and generate blade tones in the tapered spaces SP1 and SP2. In other words, the air guiding inclined edges 122c and 122d pass through the fixed position (i.e., the inner walls of the tapered spaces SP1 and SP2 to which the top plate 11I and the base plate 112 respectively correspond near the air inlets E1 and E2) of the housing 110 and generate blade tones.

Herein, the air guiding inclined edges 122c and 122d are inclined relative to the rotation axis L1 and respectively form included angles $\theta_n$ and $\alpha_n$. Therefore, changing the included angles $\theta_n$ and $\alpha_n$ can accordingly adjust the areas of the blades 122 in regions A1 and A2, and can accordingly change the spacings d1 and d2 of the blades 122 relative to the housing 110 as described above.

Based on the above, once the two adjacent blades 122 have different structural features at the air guiding inclined edges 122c and 122d, the frequency of the blade tones can be changed accordingly to avoid generating the blade tones of a fixed frequency and prevent energy accumulation of the blade tones. In this way, it is equivalent to accumulating the original blade tones at a fixed frequency into noise with greater energy and breaking it into blade tones with less energy due to frequency variation, which may naturally achieve the noise reduction effect for human hearing.

Figure 3:
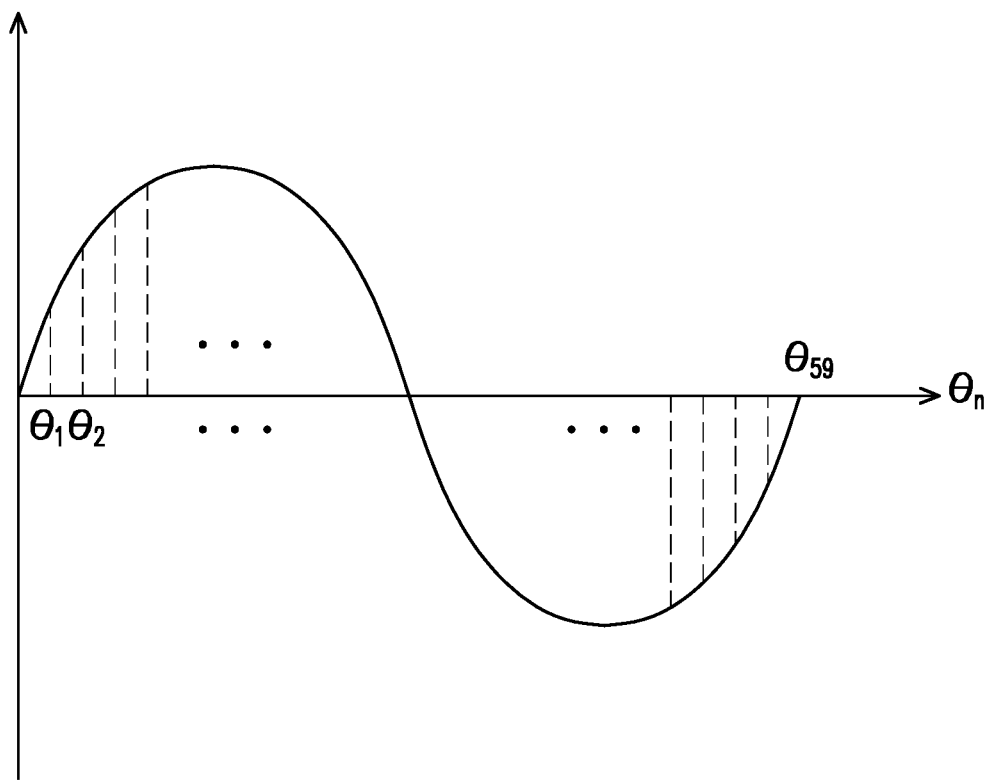
FIG. 3 is a schematic view of the design basis of a blade structure.

FIG. 3 is a schematic view of the design basis of a blade structure. With reference to FIG. 2 and FIG. 3 together, for further illustration, although generating the blade tones of varying frequencies as mentioned above can have noise reduction effect, the manufacturing process and efficiency of the blades 122 also need to be considered. Accordingly, the sizes of the blade structure in this embodiment substantially vary periodically with in accordance with the sequence in which the blades 122 surround the hub 121. With the sine wave function period shown in FIG. 3 as an example, in the design process, the included angles $\theta_n$ and $\alpha_n$ of the air guiding inclined edges 122c and 122d relative to the rotation axis L1 vary periodically according to the positions of the blades 122. In this embodiment, FIG. 3 only takes the included angle $\theta_n$ as an example. As shown in FIG. 1, 59 blades 122 are disposed surrounding the hub 121, and the included angles $\theta_n$ of these blades 122 at the air guiding inclined edge 122c may form a sequence $(\theta_n)=(\theta_1, \theta_2, \theta_3, \ldots, \theta_{59})$ along an annular direction (clockwise or counter-clockwise). After that, the angles in the included angle sequence $(\theta_n)$ are changed in accordance with the sine wave period, and sizes d3, d4, d5 of the blades 122 are changed accordingly, with $d3=d4+a*|\sin \theta_n|$ and $d5=b*|\sin \theta_n|$, where a and b are adjustable design parameters. Furthermore, the number of blades 122 in this embodiment is a prime number to avoid the symmetrical effect generated by periodic frequencies, which means in this embodiment, $|\sin \theta_1| \neq |\sin \theta_{59}|$ to avoid adjacent blades 122 having the same blade structure. Accordingly, for the fixed position of the housing 110 (for example, the inner wall of the tapered space SP1 to which the top plate 111 corresponds), each blade 122 generates blade tones of different frequencies when passing by the fixed position. Of course, this embodiment does not limit the frequency, functional form, and waveform of the periodic variation. Herein, the included angle sequence $(\theta_n)$ actually divides the 360-degree round of the impeller 120 into equal or nearly equal divisions for every two adjacent blades 122 among the blades 122 of the impeller 120 to have the same or nearly the same included angle. In addition, the gravity center of the blades 122 can be closer to the center to achieve a better balance and a better manufacturing yield. In another embodiment not shown, the included angles $\theta_n$ of the blades may also be unequally distributed, but in that case, it is necessary to provide counterweight to the blades (such as putty or reinforcement structures on the blades) to avoid the unbalanced center of gravity. The blades here also avoid generating the noise at a fixed frequency because of the unequal distribution.

In addition, with reference to FIG. 2 again, each blade 122 in this embodiment further has an extension sub-section S21 between the air guiding inclined edge 122c (or 122d) and the combining section S1. The extension sub-section S21 corresponds to the air inlet E1 or E2, and the size of the extension sub-section S21 along the rotation axis L1 is substantially equal to the size of the combining section S1 along the rotation axis L1, which provides a larger space for the air inlets E1 and E2 to facilitate air suction from the external environment.

Figure 4A:
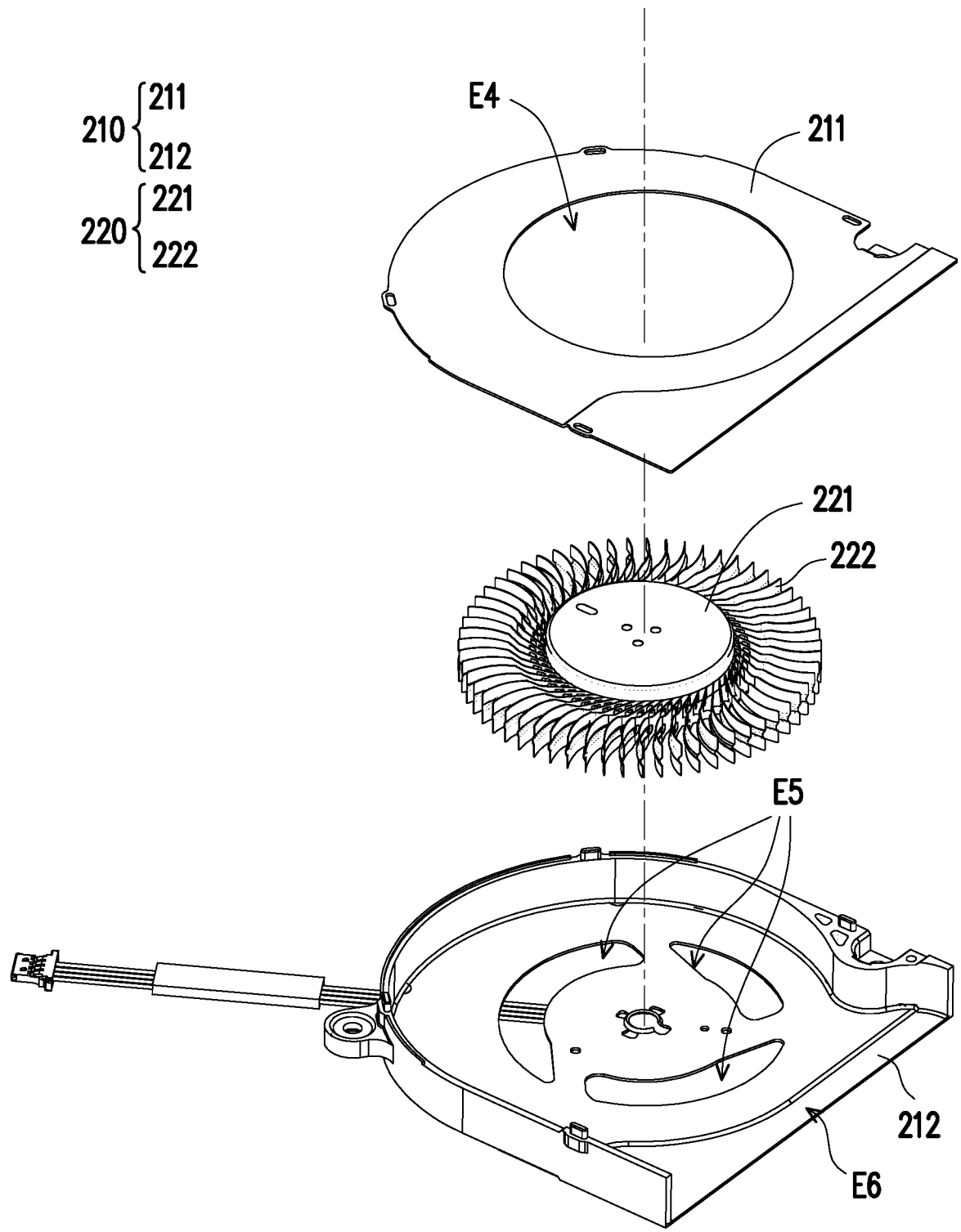
FIG. 4A is an exploded view of a centrifugal heat dissipation fan according to another embodiment of the disclosure.
Figure 4B:
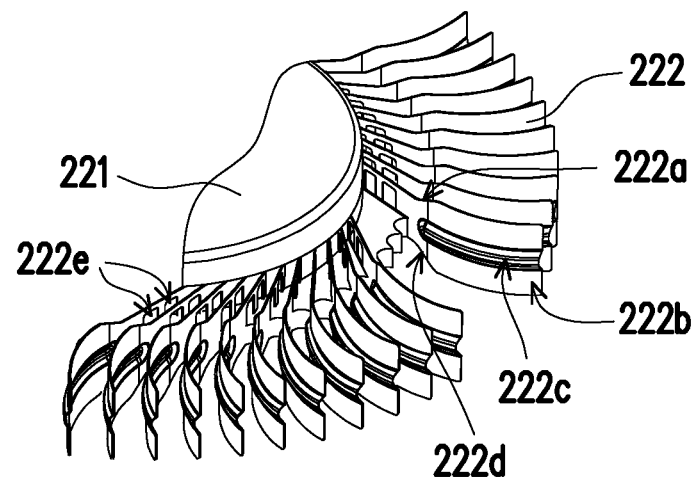
FIG. 4B is a partial enlarged view of an impeller in FIG. 4A.

FIG. 4A is an exploded view of a centrifugal heat dissipation fan according to another embodiment of the disclosure. FIG. 4B is a partial enlarged view of an impeller in FIG. 4A, with part of the blade 222 removed for easy identification. With reference to FIG. 4A and FIG. 4B together, a centrifugal heat dissipation fan 200 includes a housing 210 and the impeller 120. The housing 210 includes a top plate 211 and a base plate 212. The top plate 211 is disposed with an air inlet E4 along the axial direction (i.e., the rotation axis), and the base plate 212 is disposed with an air inlet E5 along the axial direction (i.e., the rotation axis). After the top plate 211 and the base plate 212 are combined, a lateral (radial) air outlet E6 is formed. The impeller 220 is disposed in the housing 210 and located between the top plate 211 and the base plate 212. The impeller 220 has a hub 221 and multiple blades 222 disposed surrounding the hub 221. As the centrifugal heat dissipation fan 100 mentioned above, in this embodiment, when the impeller 220 rotates, the air in the external environment is sucked into the housing 210 through the air inlets E4 and E5, and is exhausted from the housing 210 through the air outlet E6 to perform heat dissipation on a target object, such as a processor, a display chip, or a heat dissipation fin disposed in an electronic device.

Figure 4C:
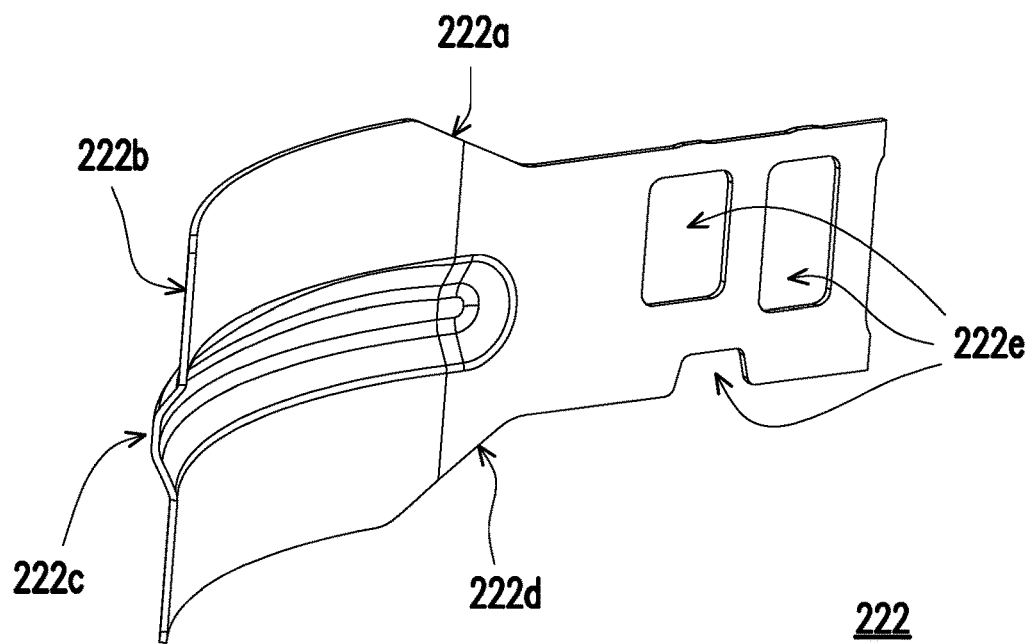
FIG. 4C is a schematic view of a blade of the impeller in FIG. 4A.
Figure 4D:
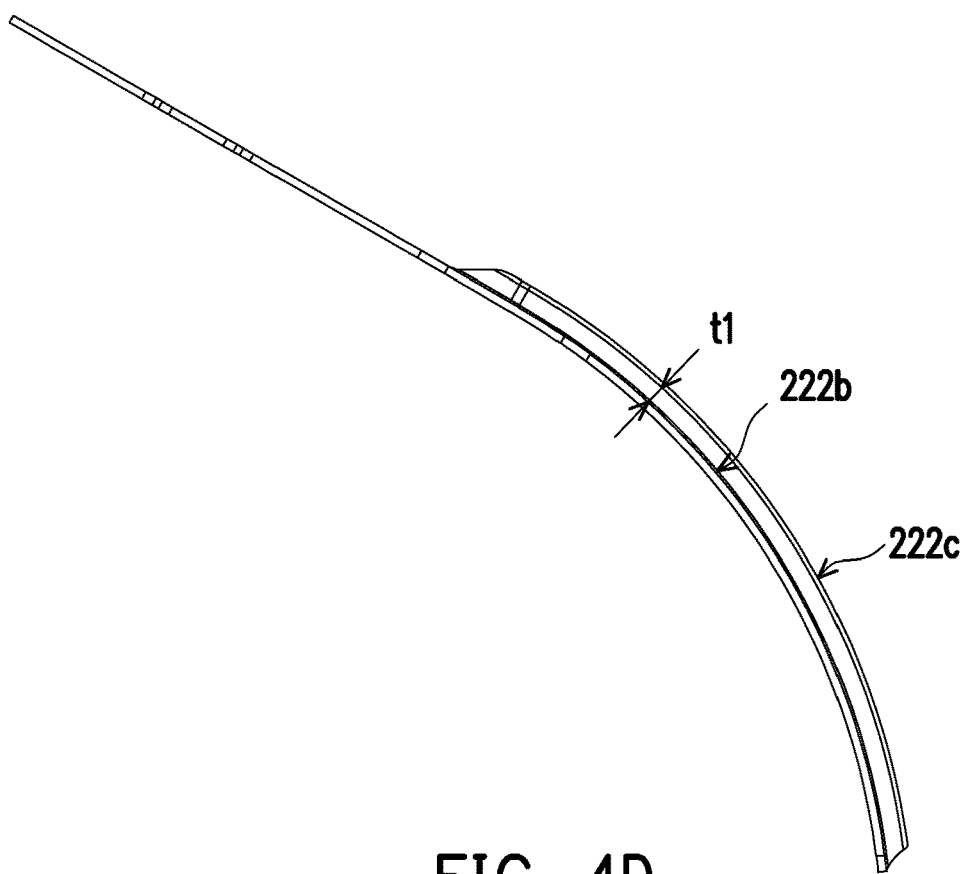
FIG. 4D is a top view of the blade in FIG. 4C.

FIG. 4C is a schematic view of a blade of the impeller in FIG. 4A. FIG. 4D is a top view of the blade in FIG. 4C. With reference to FIG. 4C and FIG. 4D together, only one single blade 222 is shown as an example, and the rest are the same as those in the previous embodiment. Here, unlike the previous embodiment where the blade edges of the blades 222 are provided as different blade structures, in this embodiment, a rib 222c is disposed on a blade surface 222b of the blade 222 (the rib 222c is concave on the back of the blade surface 222b since the rib 222c is formed by sheet metal stamping). The ribs 222c keep a protruding distance t1 from the blade surface 222b, and then the protruding distance t1 of these ribs 222c varies periodically in accordance with the sequence in which the blades 222 are disposed on the hub 221. Accordingly, when the impeller 220 rotates, these blades 222 may also generate blade tones of varying frequencies at the fixed position of the housing 210 to achieve the desired noise reduction effect. In addition, air guiding inclined edges 222a and 222d of this embodiment are the same as in the previous embodiment, and details thereof are not repeated.

In summary, in the above embodiments of the disclosure, with the blades of the centrifugal heat dissipation fan having different blade structures, which pass by the fixed position of the housing and generate the blade tones of varying frequencies when the impeller rotates at a fixed speed, noise energy at fixed frequencies or multiples thereof can be avoided to be accumulated such that the desired effect of fan blade noise reduction can be achieved.

Furthermore, in order to avoid the accumulation of noise energy at fixed frequencies or multiples thereof and also improve the manufacturing process and efficiency of the impeller, the blade structures in the disclosure are designed to show periodic variation, which means the blade structures are changed in accordance with the sequence in which the blades are disposed on the hub according to periodic frequencies. In this way, the blade tones of varying frequencies can be generated, and the difficulty and complexity of blade production are not increased because of the periodic frequencies.

What is claimed is:

1. A centrifugal heat dissipation fan, comprising:
   a housing; and
   an impeller, disposed in the housing, the impeller having a hub and a plurality of blades disposed surrounding the hub, wherein every two adjacent ones of the blades have blade structures relative to the housing that are different from each other such that the blade structures pass by a fixed position of the housing and generate blade tones of varying frequencies when the impeller rotates, wherein the blades respectively has a combining section and an air suction section, the combining section is combined with the hub, the air suction section has an air guiding inclined edge near the combining section, and the air guiding inclined edge corresponds to an air inlet of the housing.

2. The centrifugal heat dissipation fan according to claim 1, wherein sizes of the blade structures show a periodic variation in accordance with a sequence in which the blades surround the hub.

3. The centrifugal heat dissipation fan according to claim 2, wherein the periodic variation comprises a sine wave function period.

4. The centrifugal heat dissipation fan according to claim 1, wherein the housing has a top plate and a base plate, the impeller is located between the top plate and the base plate, and a pair of air inlets of the centrifugal heat dissipation fan are respectively located on the top plate and the base plate, wherein the blade structures are respectively blade edges of the blades, and every two adjacent ones of the blade edges keep different distances from the top plate.

5. The centrifugal heat dissipation fan according to claim 1, wherein the housing has a top plate and a base plate, the impeller is located between the top plate and the base plate, and a pair of air inlets of the centrifugal heat dissipation fan are respectively located on the top plate and the base plate, wherein the blade structures are respectively blade edges of the blades, and every two adjacent ones of the blade edges keep different distances from the base plate.

6. The centrifugal heat dissipation fan according to claim 1, wherein the housing has a top plate and a base plate, the impeller is located between the top plate and the base plate, and a pair of air inlets of the centrifugal heat dissipation fan are respectively located on the top plate and the base plate, wherein the fixed position is near the air inlet.

7. The centrifugal heat dissipation fan according to claim 1, wherein the blade structures are respectively ribs of the blades and are respectively located on blade surfaces of the blades.

8. The centrifugal heat dissipation fan according to claim 7, wherein the ribs keep protruding distances from the blade surfaces of the blades, and the protruding distances show a periodic variation in accordance with a sequence in which the blades surround the hub.

9. The centrifugal heat dissipation fan according to claim 1, wherein the impeller has a rotation axis, and a size of the combining section along the rotation axis is smaller than a size of the air suction section along the rotation axis.

10. The centrifugal heat dissipation fan according to claim 1, wherein the impeller has a rotation axis, and the air guiding inclined edge is inclined relative to the rotation axis and forms an included angle.

11. The centrifugal heat dissipation fan according to claim 10, wherein the included angles of the blades show a periodic variation in accordance with a sequence in which the blades surround the hub.

12. The centrifugal heat dissipation fan according to claim 1, wherein each of the blades further has an extension section between the air guiding inclined edge and the combining section, and the extension section corresponds to the air inlet.

13. The centrifugal heat dissipation fan according to claim 1, wherein the blade structures and the housing form a tapered space, and the tapered space radially tapers from an air inlet of the centrifugal heat dissipation fan relative to a rotation axis of the impeller.

14. The centrifugal heat dissipation fan according to claim 1, wherein the blade structures and the housing form a diverging space, and the diverging space radially diverges from an air inlet of the centrifugal heat dissipation fan relative to a rotation axis of the impeller.

* * * * *